United States Patent

Driver

[15] 3,657,615

[45] Apr. 18, 1972

[54] LOW THERMAL IMPEDANCE FIELD EFFECT TRANSISTOR

[72] Inventor: Michael C. Driver, Trafford, Pa.

[73] Assignee: Westinghouse Electric Corporation, Pittsburgh, Pa.

[22] Filed: June 30, 1970

[21] Appl. No.: 51,147

[52] U.S. Cl. .............317/235 R, 317/235 UA, 317/235 AM, 317/234 A, 317/234 UA, 317/235 A

[51] Int. Cl. ..........................................................H01l 11/14

[58] Field of Search ..................317/235 UA, 235 AM, 234 A, 317/234 UA, 235 A

[56] References Cited

UNITED STATES PATENTS

| | | | |
|---|---|---|---|
| 3,560,809 | 2/1971 | Terakado | 317/234 |
| 3,368,124 | 2/1968 | Ditrick | 317/235 |

OTHER PUBLICATIONS

Ames, I. et al.; I.B.M. Technical Disclosure, Vol. 9, No. 10, March 1967, pp. 1,470–1,471

Statz, H.; I.B.M. Technical Disclosure Bulletin, Vol. 11, No. 4, Sept. 1968, page 397

*Primary Examiner*—John W. Huckert
*Assistant Examiner*—Martin H. Edlow
*Attorney*—F. Shapoe and C. L. Menzemer

[57] ABSTRACT

This disclosure is directed to a Schottky Barrier field effect transistor (FET) having a low thermal impedance and to a process of producing it.

The thermal impedance of the device is reduced by reducing the thickness of a semiinsulating layer of semiconductor material through which the device is joined to a heat sink.

The process for making the device disclosed makes possible the reducing of the layer.

5 Claims, 6 Drawing Figures

PATENTED APR 18 1972 3,657,615
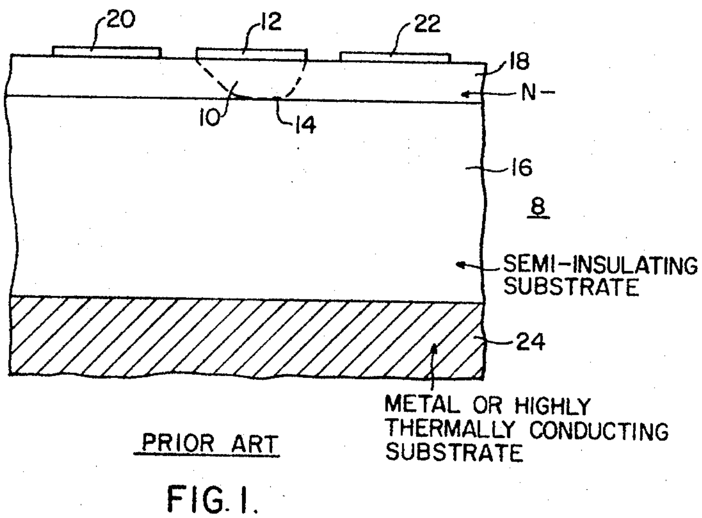
FIG. I.
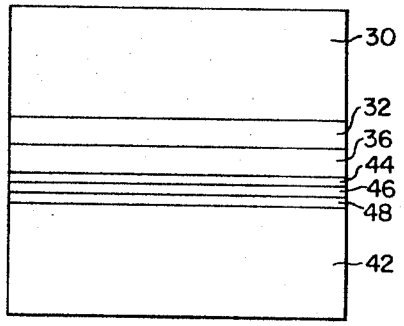
FIG. 4.
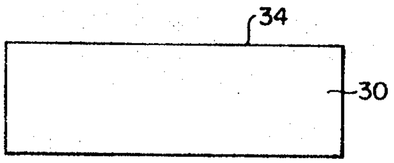
FIG. 2.
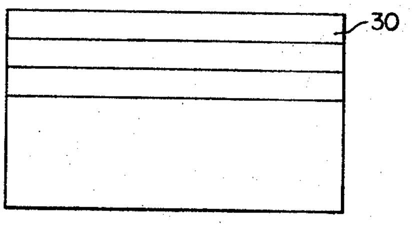
FIG. 5.
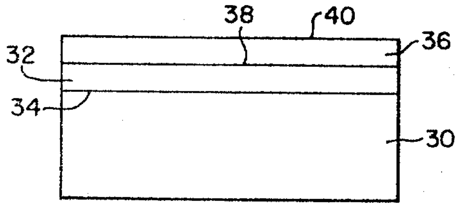
FIG. 3.
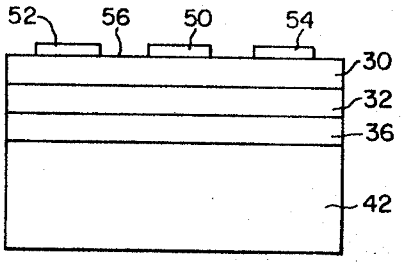
FIG. 6.
WITNESSES
Theodore F. Wrobel
Leon M. Garman
INVENTOR
Michael C. Driver
BY
C. L. Menzemer
ATTORNEY

LOW THERMAL IMPEDANCE FIELD EFFECT TRANSISTOR

BACKGROUND OF THE INVENTION

1. Field of the Invention:

This invention is in the field of semiconductor devices, particular Schottky Barrier field effect transistors, and to methods or processes for preparing such devices.

2. Description of the Prior Art:

One of the major problems in employing semiconductor power devices is the removal of heat from the point of generation within the bulk of the semiconductor material to a thermally conducting heat sink. The problem of heat removal is particularly troublesome when the semiconductor material itself has a poor thermal conductivity. Gallium arsenide is such a material.

With reference to FIG. 1, there is shown a typical prior art Schottky Barrier type field effect transistor 8.

In the operation of the prior art device of FIG. 1, a depletion layer 10 is formed beneath a gate contact 12 and most of the heat generated by and within the device 8 is produced in a thin region 14 where the edge of the depletion region 10 approaches a semiinsulating ($10^6$ ohm-cm.) substrate 16. This region 14 in a lightly doped region 18 is where all the current flows between source 20 and drain 22. Current density is at a maximum in region 14.

The heat generated in region 14 passes through the semi-insulating substrate 16 to metal heat sink 24. The thickness of the substrate 16 is a major contributor to the thermal resistance of the device 8.

For the purpose of ease of handling during processing, it has been found that the substrate 16 must be at least 50 microns thick. In gallium arsenide this means a thermal impedance of 47° C. per watt for a 1 millimeter wide device. Any process which would allow for fabrication of a device having a substrate 16 of a reduced thickness would be welcome by the industry.

SUMMARY OF THE INVENTION

In accordance with the present invention there is provided;

A process for making a Schottky Barrier field effect transistor having a low thermal impedance comprising:

1. growing a lightly doped epitaxial N-type layer on a surface of a highly doped N-type substrate of semiconductor material,
2. growing an epitaxial layer doped to a concentration of less than $10^{11}$ atoms of dopant per cc. of semiconductor material and having a resistivity of about $10^6$ ohm-cm on a first surface of said lightly doped epitaxial layer, said first surface of said lightly doped epitaxial layer being opposed to and essentially parallel to the surface of said substrate on which said lightly doped epitaxial layer is grown,
3. affixing a metallic heat sink to a surface of said layer doped to a concentration of less than $10^{11}$ atoms per cc.,
4. reducing the thickness of said substrate, and
5. affixing gate, source and drain contacts to a surface of said substrate, said surface being opposed to said surface upon which said lightly doped epitaxial layer was grown.

In addition, there is also provided;

A low thermal impedance Schottky Barrier field effect transistor comprising;

1. a layer of highly doped N-type semiconductor material, said layer having top and bottom major surfaces,
2. gate, source and drain electrical contacts disposed on said top major surface of said highly doped N-type layer,
3. an epitaxial lightly doped N-type layer of semiconductor material having opposed major surfaces grown on the bottom surface of said highly doped N-type layer along one of said major opposed surfaces,
4. an epitaxial semiinsulating layer grown along the other major opposed surface of said lightly doped layer, and
5. a heat sink affixed to said semiinsulating layer.

BRIEF DESCRIPTION OF THE DRAWING

The invention will become more readily apparent from the following exemplary description in connection with the accompanying drawings, wherein:

FIG. 1 is a side view in section of a prior art device;

FIGS. 2 to 5 are side views of a body of semiconductor material being processed in accordance with the teachings of this invention; and FIG. 6 is a Schottky Barrier field effect transistor made in accordance with the teachings of this invention.

DESCRIPTION OF THE PREFERRED EMBODIMENT

The teachings of this invention will be set forth with specific reference to gallium arsenide, it will however be understood that the teachings are equally applicable to the fabrication of devices employing other semiconductor materials.

With reference to FIG. 2, there is shown a substrate 30 of gallium arsenide suitable for use in accordance with the teachings of this invention.

The substrate 30, rather than being a semiinsulating substrate as in the prior art devices of FIG. 1, is a highly doped N-type material. The substrate 30 is doped to a concentration of from $10^{18}$ to $10^{21}$ atoms of dopant per cubic centimeter of semiconductor material.

When the substrate 30 is gallium arsenide suitable N-type dopants are silicon and tin. If the substrate 30 is silicon or any of the other known semiconductor material the usual well known N-type doping agents may be used.

The substrate 30 has a thickness of from 5 to 20 mils.

With reference to FIG. 3, an N-type epitaxial layer 32 is grown on top surface 34 of the N-type substrate 30. The epitaxial layer 32 may be grown by any of the well known epitaxial techniques known to those skilled in the art.

The N-type epitaxial layer 32 is doped to a concentration of from $10^{14}$ to $10^{16}$ atoms of dopant per cc. of semiconductor and has a thickness of from four microns when doped to about $10^{14}$ to one-half micron when doped to a concentration of about $10^{16}$ atoms per cc. of semiconductor.

If the thickness of the layer 32 is less than one-half micron the finished Schottky barrier device will pinch-off at too low a voltage to be practical. On the other hand, if layer 32 has a thickness exceeding four microns the finished Schottky barrier FET will breakdown before reaching a pinch-off voltage.

Next an epitaxial layer 36 of semi-insulating chromium doped gallium arsenide is grown on top surface 38 of layer 32. The layer 36 is doped to a concentration of less than $10^{11}$ atoms of chromium per cc. of gallium arsenide and has a resistivity of $10^6$ ohm-cm. The layer 36 has a thickness of from two to four microns. The thicker layer 36 is made the higher will be the thermal impedance of the finished Schottky Barrier device. It should be noted that in the typical prior art device of FIG. 1 the semiinsulating substrate 16 is typically about 50 microns thick.

With reference to FIG. 4, the structure as shown in FIG. 3 is inverted and surface 40 of layer 36 is joined to a heat sink 42 by layers 44, 46 and 48.

The heat sink 42 may be of any suitable metal as for example, copper, aluminum or silver.

Very satisfactory results have been obtained when layer 44 is a 5,000 A. thick nickel layer, layer 46 is a 2 micron thick layer of tin and layer 48 is a 4 micron thick layer of gold. The gold-tin eutectic formed during the bonding of the heat sink 42 to semiinsulating layer can be heated to 450° C. without any deleterious effect. This far exceeds any temperatures the device will encounter during operation.

In the alternative, a heat sink can be formed on surface 40 of the semiinsulating layer 36 by vapor deposition, plating or sputtering. A heat sink formed in this manner should have a thickness of about 10 microns.

With reference to FIG. 5, the N-type substrate is now etched to a thickness of about five microns. The etching process can be carried out by any suitable process known to those skilled in the art.

With reference to FIG. 6, a gate contact 50 and source and drain contacts 52 and 54 are then affixed to surface 56 of the layer 30.

Satisfactory results have been achieved with a gate contact consisting of aluminum and source and drain contacts consisting of an alloy consisting of 88 percent, by weight, gold and 12 percent by weight germanium. An equally suitable alloy for the source and drain contacts is one consisting of all parts by weight, 90 percent silver, 5 percent indium and 5 percent germanium.

The resulting structure shown in FIG. 6 is a Schottky Barrier Field Transistor. Due to the fact that the process set forth in this invention provides a method of making a device in which the semiinsulating layer can be reduced by a factor of about 10 over prior art devices, the device of this invention has a lower thermal impedance than prior art devices by a factor of about 2.0 to 2.5.

I claim as my invention:

1. A low thermal impedance Schottky Barrier field effect transistor comprising:

1. a layer of highly doped N-type semiconductor material, said layer having top and bottom major surfaces,
2. gate, source and drain electrical contacts disposed on said top major surface of said highly doped N-type layer said gate contact forming a Schottky Barrier contact with said layer,
3. an epitaxial lightly doped N-type layer of semiconductor material having opposed major surfaces grown on the bottom surface of said highly doped N-type layer along one of said major opposed surfaces,
4. an epitaxial semiinsulating layer grown along the other major opposed surface of said lightly doped layer having a thickness of from 2 to 4 microns, and
5. a heat sink affixed to said semiinsulating layer.

2. The transistor of claim 1 in which:

1. said layer of highly doped N-type semiconductor material is doped to a concentration of from $10^{18}$ to $10^{21}$ atoms per cc,
2. said lightly doped epitaxial layer of N-type semiconductor material is doped to a concentration of from $10^{14}$ to $10^{16}$ atoms per cc; and
3. said semiinsulating layer is doped to a concentration of less than $10^{11}$ atoms per cc and has a resistivity of about $10^{6}$ ohm-cm.

3. The transistor of claim 5 in which said gate contact is aluminum and said source and drain contacts consist of an alloy selected from the group consisting of (1) 88 percent by weight, gold and 12 percent by weight germanium, and (2) 90 percent by weight, silver, 5 percent by weight, indium and 5 percent by weight, germanium.

4. The device of claim 5 in which the semiconductor material is gallium arsenide.

5. A low thermal impedance Schottky Barrier field effect transistor comprising:

1. a layer of highly doped N-type semiconductor material have a thickness of about 5 microns, said layer having top and bottom major surfaces,
2. gate, source and drain electrical contacts disposed on said top major surface of said highly doped N-type layer said gate contact forming a Schottky Barrier contact with said layer,
3. an epitaxial lightly doped N-type layer of semiconductor material have a thickness of from one-half to 4 microns and having opposed major surfaces grown on the bottom surface of said highly doped N-type layer along one of said major opposed surfaces,
4. an epitaxial semiinsulating layer grown along the other major opposed surface of said lightly doped layer having a thickness of from 2 to 4 microns, and
5. a heat sink affixed to said semiinsulating layer.

* * * * *